(12) United States Patent  
Mayuzumi

(10) Patent No.: US 8,636,927 B2
(45) Date of Patent: Jan. 28, 2014

(54) ZNO DEPOSITION MATERIAL AND ZNO FILM FORMED OF THE SAME

(75) Inventor: Yoshitaka Mayuzumi, Moriya (JP)

(73) Assignee: Mitsubishi Materials Corporation, Tokyo (JP)

( * ) Notice: Subject to any disclaimer, the term of this patent is extended or adjusted under 35 U.S.C. 154(b) by 425 days.

(21) Appl. No.: 12/298,167

(22) PCT Filed: Apr. 19, 2007

(86) PCT No.: PCT/JP2007/058518
§ 371 (c)(1),
(2), (4) Date: Oct. 23, 2008

(87) PCT Pub. No.: WO2007/125814
PCT Pub. Date: Nov. 8, 2007

(65) Prior Publication Data
US 2009/0242851 A1  Oct. 1, 2009

(30) Foreign Application Priority Data

Apr. 26, 2006 (JP) ................................. 2006-121403
Sep. 8, 2006 (JP) ................................. 2006-244144
Mar. 9, 2007 (JP) ................................. 2007-060081

(51) Int. Cl.
*H01B 1/02* (2006.01)
(52) U.S. Cl.
USPC ....................... 252/519.5; 420/513; 106/286.2
(58) Field of Classification Search
USPC .................. 252/519.5, 519.51; 428/688, 702; 420/513; 106/286.2
See application file for complete search history.

(56) References Cited

U.S. PATENT DOCUMENTS

| 3,664,867 | A | * | 5/1972 | Galli et al. | ..................... 428/336 |
| 5,236,632 | A | * | 8/1993 | Ogawa et al. | .............. 252/519.5 |
| 5,854,586 | A | * | 12/1998 | McMillan et al. | .............. 338/21 |
| 2009/0085014 | A1 | * | 4/2009 | Ikisawa et al. | ................ 252/512 |

FOREIGN PATENT DOCUMENTS

| JP | 04-141909 A | 5/1992 |
| JP | 04-219359 A | 8/1992 |
| JP | 6-2130 A | 1/1994 |
| JP | 10-088332 A | 4/1998 |
| JP | 2000-026119 A | 1/2000 |
| JP | 2000-040429 A | 2/2000 |

OTHER PUBLICATIONS

Machine translation of JP2000-040429.*

* cited by examiner

Primary Examiner — Mark Kopec
Assistant Examiner — Haidung Nguyen
(74) Attorney, Agent, or Firm — Leason Ellis LLP

(57) ABSTRACT

A ZnO deposition material to be used for forming a transparent conductive film is composed of a ZnO pellet made of ZnO powder having a ZnO purity of 98% or more. The pellet includes one or more kinds of elements selected from the group consisting of Y, La, Sc, Ce, Pr, Nd, Pm and Sm. The ZnO pellet is polycrystal or monocrystal. The ZnO film formed by a vacuum film forming method employing the ZnO deposition material as a target material can exhibit excellent conductivity. The vacuum film forming method is preferably an electron beam vapor deposition method, an ion plating method or a sputtering method.

7 Claims, No Drawings

ZNO DEPOSITION MATERIAL AND ZNO FILM FORMED OF THE SAME

CROSS-REFERENCE TO PRIOR APPLICATION

This is the U.S. National Phase Application under 35 U.S.C. §371 of International Patent Application No. PCT/JP2007/058518 filed Apr. 19, 2007, which claims the benefit of Japanese Patent Application Nos. 2006-121403 filed Apr. 26, 2006, 2006-244144 filed Sep. 8, 2006 and 2007-060081 filed Mar. 9, 2007, all of them are incorporated by reference herein. The International Application was published in Japanese on Nov. 8, 2007 as WO2007/125814 A1 under PCT article 21(2).

TECHNICAL FIELD

The present invention relates to a ZnO deposition material used for forming films, for example, a transparent conductive film used for solar cells, or a film used for liquid crystal display devices, electroluminescence display devices, transparent electrodes of a transparent piezoelectric sensor in a touch panel device, active matrix drivers constituting a display device, antistatic conductive film coatings, gas sensors, electromagnetic shielding panels, piezoelectric devices, photoelectric converters, luminescence devices, thin film type secondary cells, or the like, and a ZnO film formed of the same.

BACKGROUND OF THE INVENTION

In recent years, transparent conductive films have been indispensable when manufacturing photoelectric converters such as solar cells. For a conventional transparent conductive film, an indium tin oxide (ITO) film (a tin-doped indium oxide film) is known. The ITO film has the advantages of excellent transparency and low resistance.

Meanwhile, there has been a need for cost reduction in solar cells, liquid crystal display devices, or the like. However, since indium is expensive, when the ITO film was employed as a transparent conductive film, there was a disadvantage in that the solar cell inevitably became expensive as well. In addition, in the case of manufacturing solar cells or the like, an amorphous silicon film is formed on a transparent conductive film by a plasma chemical vapor deposition (CVD) method. At the time, if the transparent conductive film was an ITO film, there was a problem in that hydrogen plasma upon plasma CVD led to deterioration of the ITO film.

In order to solve such problems, it has been proposed that a zinc oxide-based film doped with a conductive active element such as Al, B, or Si which can be prepared with less budget be used as a transparent conductive film such as solar cells or the like, and a zinc oxide-based sputtering target be used to form a zinc oxide-based film by sputtering (for example, see Japanese Unexamined Patent Application No. Hei 6-2130 (claims 2, 3, and 4)). According to this zinc oxide-based sputtering target, an extremely low resistance zinc oxide-based sintered body can be obtained by containing a predetermined amount of the foregoing conductive active element in zinc, and sintering density and conductivity of this sintered body are improved if the raw material powder is fine and has high dispersibility.

SUMMARY OF THE INVENTION

However, if sputtering is carried out to form a film at high speed using the above-mentioned zinc oxide-based sputtering target while applying high voltage, there were disadvantages in that an abnormal electrical discharge was easily generated, the target was inhomogeneously consumed because of an unstable discharge state, compositional shift occurred in the obtained film, and it became difficult to obtain a low resistance film. On the other hand, if the voltage was decreased by decreasing electric power to be applied, there were disadvantages in that the speed of film formation was lowered, and the efficiency of zinc oxide-based film formation was significantly reduced.

An object of the invention is to provide a ZnO deposition material capable of forming a relatively low resistance film at high speed, and a ZnO film using the same.

The first aspect of the invention is a ZnO deposition material used to form a transparent conductive film.

The structure is characterized in that the material is composed of a ZnO pellet made of ZnO powder having a ZnO purity of 98% or more, and the pellet includes one or more kinds of elements selected from the group consisting of Y, La, Sc, Ce, Pr, Nd, Pm and Sm.

In the ZnO deposition material in this case, if a ZnO film is formed with the use of the ZnO deposition material in which the concentration of one or more kinds of elements selected from the group consisting of Y, La, Sc, Ce, Pr, Nd, Pm and Sm in the ZnO pellet is in the above range, the ZnO film can obtain good conductivity over a wide range of temperature.

Another aspect of the invention is further characterized in that the ZnO pellet is polycrystal or monocrystal.

In this ZnO deposition material, the effect is dramatically changed by differences of the composition, not whether the ZnO pellet is polycrystal or monocrystal. Consequently, not only in the case where the ZnO pellet is polycrystal, but also in the case where the ZnO pellet is monocrystal, if it has the composition within the range according to claim 1, the ZnO film can exhibit an excellent conductivity over a wide temperature range when a ZnO film is formed with the use of such a ZnO deposition material.

Another aspect of the invention is a ZnO film formed by a vacuum film forming method in which the ZnO deposition material is a target material.

This vacuum film forming method is preferably an electron beam vapor deposition method, an ion plating method, or a sputtering method.

As described above, according to the invention, a ZnO deposition material is composed of a ZnO pellet made of ZnO powder having a ZnO purity of 98% or more, and this pellet includes a predetermined amount of one or more kinds of element selected from the group consisting of Y, La, Sc, Ce, Pr, Nd, Pm and Sm. Therefore, if a ZnO film is formed with the use of this ZnO deposition material, the ZnO film can obtain good conductivity.

In addition, since the ZnO pellet is not only polycrystal but also monocrystal, if a ZnO film is formed using a ZnO deposition material having the composition within the above range, the ZnO film can obtain good conductivity

DETAILED DESCRIPTION OF THE INVENTION

Next, a best mode for carrying out the invention will be described.

The present inventors investigated the effect on conductivity in impurity species and the content in a ZnO deposition material and the ZnO film formed using this deposition material, and have found that the concentration of one or more kinds of element selected from the group consisting of Y, La, Sc, Ce, Pr, Nd, Pm and Sm in ZnO pellet greatly influenced the film. As the concentration of one or more kinds of element selected from the group consisting of Y, La, Sc, Ce, Pr, Nd, Pm and Sm in ZnO pellet increases, the conductivity of a ZnO film becomes better. However, the concentration further increases, and the conductivity adversely deteriorates. Accordingly, when considering application to products, it has been realized that there is the optimal concentration range of one or more kinds of elements selected from the group consisting of Y, La, Sc, Ce, Pr, Nd, Pm and Sm. Misch metal (may be denoted Mm), which is a mixture consisting primarily of La, Ce, and Nd, is included in the above one or more kinds of element selected from the group consisting of Y, La, Sc, Ce, Pr, Nd, Pm and Sm.

A ZnO deposition material of the invention whose concentration of one or more kinds of element selected from the group consisting of Y, La, Sc, Ce, Pr, Nd, Pm and Sm is adjusted is used to form a transparent conductive film. This pellet preferably has a diameter of 5 to 50 mm and a thickness of 2 to 30 mm. The reason for the diameter of this pellet being 5 to 50 mm is to carry out film formation with stability and high speed. In the case where the diameter is less than 5 mm, there is a problem in that splashes are generated. In the case where the diameter is more than 50 mm, there are problems in that inhomogeneous films are formed and there is a decrease in speed, which are caused by decreasing a filling ratio to a hearth (deposition material crucible). The reason for the thickness being 2 to 30 mm is to carry out film formation with stability and high speed. In the case where the diameter is less than 2 mm, there is a problem in that splashes are generated. In the case where the diameter is more than 30 mm, there are problems in that inhomogeneous films are formed and there is a decrease in speed, which are caused by decreasing a filling ratio to a hearth (deposition material crucible).

In addition, this ZnO deposition material is composed of a polycrystal ZnO pellet made of ZnO powder having a ZnO purity of 98% or more, preferable 98.4% or more. The reason why the ZnO purity of ZnO powder is limited to 98% or more is that impurities lead to a decrease of the conductivity of a ZnO film if the purity is less than 98%. Further, in this ZnO deposition material, a polycrystal ZnO pellet having a relative density of 90% or more, preferably 95% or more, is preferred. The reason for setting the relative density to be 90% or more is that splashes upon film formation are increased in the case where the relative density is less than 90%. In addition, the ZnO pellet composition is polycrystal in this embodiment, but it may be monocrystal.

Elements such as the above-mentioned Y, La, and Sc in a ZnO deposition material are preferably 2 to 20% by mass, preferably 3 to 6% by mass. The reason why the above-mentioned elements such as Y, La, and Sc are set at 2 to 20% by mass is to improve the conductivity of a ZnO film. If the elements are less than 2% by mass, they do not contribute to improvement of the conductivity of the ZnO film. If the elements are more than 20% by mass, problems such as a decrease in conductivity of the ZnO film and deterioration in permeability occur. Meanwhile, in the case where these elements are very small amounts, the elements do not exist as a granular precipitate in grain boundaries or a grain of a ZnO matrix but are uniformly dispersed in the ZnO deposition material. In addition, the above-mentioned elements are present in the ZnO deposition material as an oxide. More specifically, Y exists in a form of $Y_2O_3$, and La exists in a form of $La_2O_3$. Sc exists in a form of $Sc_2O_3$, and Ce is considered to exist in a form of $CeO_2$ or $Ce_2O_3$. Pr is considered to exist in a form of $Pr_6O_{12}$, and Nd is considered to exist in a form of $Nd_2O_3$. In addition, Pm is considered to exist in a form of $Pm_2O_3$, and Sm is considered to exist in a form of $Sm_2O_3$.

For a ZnO deposition material of the invention thus constituted, a tri- or higher-valent rare earth element is added, as a result, excess carrier electrons can be generated to divalent Zn. In the case where the rare earth elements are added to a ZnO deposition material, they are resistant to a compositional shift upon vapor deposition, and a desired composition rate in the film can be kept. As the conductive mechanism, the conductivity is performed by oxygen defect, other than compulsive injection of carrier electrons. Usually oxygen gas is introduced in a vapor deposition method, but generally oxygen in the film composition is insufficient. Upon transparent conductive film formation, a technique in which resistance is lowered by generating oxygen defect is adopted. However, in the case of adding a rare earth element, it is easy to control because the element is excellent in evaporation performance. In the present invention, conductivity like ITO can be obtained by utilizing this feature using additive elements other than Al and Ga.

Next, the method for manufacturing a ZnO deposition material of the present invention will be illustrated for the case where the additive element is Ce and the material is prepared by a sintering method.

First of all, high purity ZnO powder having a purity of 98% or more, high purity cerium oxide powder having a Ce concentration ranging from 2 to 20% by mass, a binder, and an organic solvent are mixed to prepare a slurry having the concentration of 30 to 75% by mass. A slurry which has the concentration of preferably 40 to 65% by mass is prepared. The reason why the slurry concentration is limited to 30 to 75% by mass is that stable granulation is difficult since the above-mentioned slurry is a non-aqueous system when the concentration is more than 75% by mass or more, and a dense ZnO sintered body having a uniform composition cannot be obtained when the concentration is less than 30% by mass. The average grain diameter of ZnO powder is preferably in the range of 0.1 to 5.0 μm. The reason why the average grain diameter of ZnO powder is limited within the above-mentioned range is that if the average grain diameter is less than the lower limit, the powder is too fine and clumps together, the handleability of the powder deteriorates, and makes it difficult to prepare a high concentration slurry; and if the average grain diameter is more than the upper limit, it is difficult to control a fine structure and a dense pellet cannot be obtained.

Considering the prevention of maldistribution of Ce abundance, reactivity with a ZnO matrix, and the purity of a Ce compound, it is preferable to add cerium oxide particles whose primary particle diameter is of the nanometer-scale. It is preferable to use polyethylene glycol, polyvinyl butyral, or the like for a binder, and ethanol, propanol, or the like for an organic solvent. It is preferable to add the binder at 0.2 to 5.0% by mass.

Wet blending of high purity powder, a binder, and an organic solvent, particularly wet blending of high purity powder and an organic solvent as a dispersion medium is performed by a wet ball mill or a stirring mill.

In the case of using a $ZrO_2$ ball in the wet ball mill, a wet blending is performed using a large number of $ZrO_2$ balls having a diameter of 5 to 10 mm for 8 to 24 hours, preferably 20 to 24 hours. The reason why the diameter of $ZrO_2$ ball is limited to 5 to 10 mm is that if the diameter is smaller than 5 mm, the blending is insufficient; and if the diameter is larger than 10 mm, impurities are increased. The reason why the blending time is long, up to 24 hours, is that impurities are hardly generated even if a continuous blending for a long time is performed.

In the stirring mill, wet blending is performed using a $ZrO_2$ ball having a diameter of 1 to 3 mm for 0.5 to 1 hour(s). The reason why the diameter of $ZrO_2$ ball is limited to 1 to 3 mm is that if the diameter is smaller than 1 mm, the blending is insufficient; and if the diameter is larger than 3 mm, impurities are increased. The reason why the blending time is a maximum of 1 hour in short is that if the blending time is over 1 hour, even if the raw materials are mixed, the ball per se wears away and leads to generation of impurities. Also, sufficient blending can be done within 1 hour.

Then, the above-mentioned slurry is spray-dried to obtain a mixing granulation powder having an average grain diameter of 50 to 250 µm, preferably 50 to 200 µm. This granulation powder is put into a predetermined mold and is molded under predetermined pressure. The above-mentioned spray drying is preferably performed with the use of a spray drier. A uniaxial pressing device or a CIP (Cold Isostatic Press) molding device is used for the predetermined mold.

In the uniaxial pressing device, the granulation powder is subjected to uniaxial pressing with a pressure of 750 to 2,000 kg/cm² (73.55 to 196.1 MPa), preferably 1,000 to 1,500 kg/cm² (98.1 to 147.1 MPa).

In the CIP molding device, the granulation powder is subjected to CIP pressing with a pressure of 1,000 to 3,000 kg/cm² (98.1 to 294.2 MPa), preferably 1,500 to 2,000 kg/cm² (147.1 to 196.1 MPa).

The reason why the pressure is limited within the above-mentioned range is that deformation after sintering is prevented and post-working is not required, in addition to increasing a compact density.

Furthermore, the compact is sintered at a predetermined temperature. Sintering is performed in air, an inert gas, a vacuum, or a reductive gas atmosphere at a temperature of 1,000° C. or higher, preferably 1,200 to 1,400° C. for 1 to 10 hour(s), preferably 2 to 5 hours. As a result of this, a pellet having a relative density of 90% or more can be obtained. The above-mentioned sintering is performed under air pressure, but in the case where pressure sintering such as Hot Press (HP) sintering and Hot Isostatic Press (HIP) sintering is performed, the sintering is preferably performed in an inert gas, a vacuum, or a reductive gas atmosphere at a temperature of 1,000° C. or higher for 1 to 5 hour(s). Using the thus obtained polycrystal ZnO deposition material of a pellet as a target material, a ZnO film is formed on the surface of a substrate by a vacuum film forming method.

In addition, while the explanation is described with Ce as an additive element, in the case of using Y, La, Sc, Pr, Nd, Pm, or Sm, a ZnO deposition material is manufactured in the same manner as in the above using Y, La, Sc, Pr, Nd, Pm, or Sm in place of the above-mentioned Ce.

Meanwhile, examples of the vacuum film forming method to form the above ZnO film may include an electron beam vapor deposition method, an ion plating method, a sputtering method, and the like.

EXAMPLES

Next, the present invention will be illustrated with reference to Examples together with a Comparative Example.

Example 1

As a ZnO deposition material, a polycrystal ZnO pellet in which the relative density was 95%, and the concentration of Ce included in this ZnO deposition material was 5% by mass was arranged. The diameter and thickness of this ZnO deposition material were 5 mm and 1.6 mm, respectively. In addition, a ZnO purity of ZnO powder is 99%.

Next, a ZnO film having a thickness of 200 nm was formed on a glass substrate by an electron beam vapor deposition method using the above-mentioned ZnO deposition material. The film forming conditions were that an ultimate vacuum was $1.0 \times 10^{-4}$ Pa, oxygen gas partial pressure was $1.0 \times 10^{-2}$ Pa, substrate temperature was 200° C., and speed of film formation was 0.5 nm/sec.

Example 2

A ZnO film was formed in the same manner as in Example 1, except that a ZnO deposition material was used in which the Sc concentration in a polycrystal ZnO pellet prepared by a sintering method (plate-like pellet about 5 by 5 by 2 mm) was 3 to 6% by mass.

Example 3

A ZnO film was formed in the same manner as in Example 1, except that a ZnO deposition material was used in which the Y concentration in a polycrystal ZnO pellet prepared by a sintering method (plate-like pellet about 5 by 5 by 2 mm) was 3 to 6% by mass.

Example 4

A ZnO film was formed in the same manner as in Example 1, except that a ZnO deposition material was used in which the La concentration in a polycrystal ZnO pellet prepared by a sintering method (plate-like pellet about 5 by 5 by 2 mm) was 3 to 6% by mass.

Example 5

A ZnO film was formed in the same manner as in Example 1, except that a ZnO deposition material was used in which the Pr concentration in a polycrystal ZnO pellet prepared by a sintering method (plate-like pellet about 5 by 5 by 2 mm) was 3 to 6% by mass.

Example 6

A ZnO film was formed in the same manner as in Example 1, except that a ZnO deposition material was used in which the Nd concentration in a polycrystal ZnO pellet prepared by a sintering method (plate-like pellet about 5 by 5 by 2 mm) was 3 to 6% by mass.

Example 7

A ZnO film was formed in the same manner as in Example 1, except that a ZnO deposition material was used in which the Pm concentration in a polycrystal ZnO pellet prepared by a sintering method (plate-like pellet about 5 by 5 by 2 mm) was 3 to 6% by mass.

Example 8

A ZnO film was formed in the same manner as in Example 1, except that a ZnO deposition material was used in which the Sm concentration in a polycrystal ZnO pellet prepared by a sintering method (plate-like pellet about 5 by 5 by 2 mm) was 3 to 6% by mass.

Comparative Example 1

A polycrystal ZnO pellet in which the relative density was 95% was arranged as a ZnO deposition material. That is, a ZnO pellet not containing any of Y, La, Sc, Ce, Pr, Nd, Pm and Sm in ZnO was prepared. The diameter and thickness of this ZnO deposition material were 5 mm and 1.6 mm, respectively. A ZnO film was formed in the same manner as in Example 1 except for using this ZnO deposition material. In addition, a ZnO purity of ZnO powder is 99%.

Comparison Test and Evaluation

Specific resistance and permeability of the obtained ZnO film in Examples 1 to 8 and Comparative Example 1 were measured. The specific resistance was measured by a four terminal four probe method with constant current application at a so-called normal temperature of 25° C. in an atmosphere using Loresta from Mitsubishi Chemical Corporation (HP MCP-T410, probe in series, 1.5 mm pitch) as a measuring instrument. The permeability in a visible wavelength range (380 to 780 mm) was measured using a spectrophotometer U-4000 manufactured by Hitachi, Ltd. as a measuring instrument, placing a substrate after film formation vertically to measuring light. These measurement results are shown in Table 1.

TABLE 1

|  | Additive Element | Specific Resistance ($\Omega$ cm) | Permeability (%) |
| --- | --- | --- | --- |
| Example 1 | Ce | $8.3 \times 10^{-4}$ | 88 |
| Example 2 | Sc | $9.2 \times 10^{-4}$ | 87 |
| Example 3 | Y | $9.5 \times 10^{-4}$ | 89 |
| Example 4 | La | $8.4 \times 10^{-4}$ | 91 |
| Example 5 | Pr | $1.8 \times 10^{-3}$ | 92 |
| Example 6 | Nd | $2.3 \times 10^{-3}$ | 90 |
| Example 7 | Pm | $3.1 \times 10^{-3}$ | 89 |
| Example 8 | Sm | $2.9 \times 10^{-3}$ | 91 |
| Comp. Ex 1 | None | $2.0 \times 10^{-2}$ | 93 |

As is clear from Table 1, although the permeability for Examples 1 to 8 was low as compared with 93% of Comparative Example 1, 87% is indicated in Example 2, which showed the lowest value. The ZnO films in Examples 1 to 8 can be completely used in practical use. Meanwhile, as is clear from Table 1, the specific resistance in Examples 1 to 8 showed significantly low values as compared with the specific resistance in Comparative Example 1. Accordingly, it turns out that a film having comparatively low resistance can be formed at high speed in the ZnO deposition material of the present invention.

As described above, according to the invention, a ZnO deposition material is composed of a ZnO pellet made of ZnO powder having a ZnO purity of 98% or more, the pellet including a predetermined amount of one or more kinds of elements selected from the group consisting of Y, La, Sc, Ce, Pr, Nd, Pm and Sm. Therefore, if a ZnO film is formed using this ZnO deposition material, the ZnO film can realize excellent conductivity.

In addition to the ZnO pellet being polycrystal, even if it is monocrystal, the ZnO film can realize excellent conductivity if a ZnO film is formed using the ZnO deposition material having the composition within the above-mentioned range. Consequently, the present invention is extremely useful in the industrial field.

The invention claimed is:

1. A ZnO deposition material for formation of a transparent conductive film comprising:
    a ZnO pellet made of ZnO powder having a ZnO purity of 98% or more,
    wherein the pellet includes Ce,
    the content of Ce is 2 to 20% by weight in the ZnO deposition material and the pellet has a diameter of 5 to 50 mm and a thickness of 2 to 30 mm.

2. The ZnO deposition material according to claim 1, wherein the ZnO pellet is polycrystal or monocrystal.

3. A ZnO film which is formed by a vacuum film forming method using the ZnO deposition material according to claim 1 as a target material.

4. The ZnO film according to claim 3, wherein the vacuum film forming method is an electron beam vapor deposition method, an ion plating method, or sputtering method.

5. The ZnO deposition material according to claim 1, wherein the content of Ce is 3 to 6% by weight in the ZnO deposition material.

6. The ZnO deposition material according to claim 1, wherein Ce is present as an oxide in the ZnO deposition material.

7. The ZnO deposition material according to claim 1, wherein the pellet has a relative density of 90% or more.

* * * * *